United States Patent
Chang et al.

(10) Patent No.: US 10,082,566 B2
(45) Date of Patent: Sep. 25, 2018

(54) PARKING SPACE STATUS SENSING SYSTEM AND METHOD

(71) Applicant: U&U ENGINEERING INC, Taipei (TW)

(72) Inventors: Chi-Ho Chang, Taipei (TW); Meng-Xi Wu, Taipei (TW); Houng-Ti Chiang, Taipei (TW); Guo-Zhong Lu, Taipei (TW); Chao-Fu Chiang, Taipei (TW); Jing-Chung Xu, Taipei (TW); Sen Wang, Taipei (TW)

(73) Assignee: U&U ENGINEERING INC., Taipei (TW)

( * ) Notice: Subject to any disclaimer, the term of this patent is extended or adjusted under 35 U.S.C. 154(b) by 90 days.

(21) Appl. No.: 15/430,572

(22) Filed: Feb. 13, 2017

(65) Prior Publication Data

US 2017/0343659 A1 Nov. 30, 2017

Related U.S. Application Data (60) Provisional application No. 62/343,022, filed on May 30, 2016.

(51) Int. Cl.
*G01S 13/00* (2006.01)
*G01S 13/04* (2006.01)
(Continued)

(52) U.S. Cl.
CPC .............. *G01S 13/04* (2013.01); *G01S 13/10* (2013.01); *G01S 13/103* (2013.01); *G01R 27/06* (2013.01)

(58) Field of Classification Search
CPC .......... G01S 13/00; G01S 13/02; G01S 13/04; G01S 13/06; G01S 13/08; G01S 13/10; G01S 13/103; G01S 13/52; G01S 13/56; G01S 15/00; G01S 15/02; G01S 15/04; G01S 15/50; G01S 15/52; G01S 15/523;
(Continued)

(56) References Cited

U.S. PATENT DOCUMENTS

2005/0225439 A1 10/2005 Watanabe et al.
2008/0291097 A1 11/2008 Fukushima et al.
2009/0322591 A1* 12/2009 Matsuoka .............. G01S 13/18
342/70
(Continued)

FOREIGN PATENT DOCUMENTS

CN 1701242 A 11/2005
CN 101032052 A 9/2007
(Continued)

*Primary Examiner* — Hoai-An D Nguyen
(74) *Attorney, Agent, or Firm* — Soroker Agmon Nordman (57) ABSTRACT

A parking space status sensing system is used for detecting a state of a parking space. A parking space status sensing system includes a first antenna array transmitting a first signal, a second antenna array receiving a second signal feedback reflected from an object, a radio-frequency transceiver receiving the second signal and performing down-conversion and demodulation on the second signal with receiving a local signal modulated from a triangularly modulated signal by the radio-frequency transceiver, to generate a first beat frequency signal. An analog-distance-signal-integral information and an analog-speed-signal-integral information of the object are obtained from the first beat frequency signal by related analog signal processes.

21 Claims, 3 Drawing Sheets

(51) Int. Cl.
*G01S 13/10* (2006.01)
*G01R 27/06* (2006.01)

(58) Field of Classification Search
CPC ........ G01S 17/00; G01S 17/02; G01S 17/026;
G01R 27/00; G01R 27/06; G01R 27/28;
G01R 29/00; G01R 29/08; G01R
29/0807; G01R 29/0814; G01R 29/085
USPC ................ 324/600, 629, 637, 638, 642, 646
See application file for complete search history.

(56) References Cited

U.S. PATENT DOCUMENTS

| | | | |
|---|---|---|---|
| 2010/0073229 A1 | 3/2010 | Pattabiraman et al. | |
| 2012/0194377 A1 | 8/2012 | Yukumatsu et al. | |
| 2014/0169134 A1* | 6/2014 | Hod | G01S 7/52004 367/93 |
| 2016/0013547 A1 | 1/2016 | Tishin et al. | |
| 2016/0171890 A1* | 6/2016 | Galli | G01S 7/52004 367/93 |
| 2017/0129400 A1* | 5/2017 | Subramanya | B60Q 9/002 |
| 2017/0148230 A1* | 5/2017 | Richard | G07B 15/02 |
| 2017/0371060 A1* | 12/2017 | Nogueira-Nine | G01V 3/081 |
| 2018/0025640 A1* | 1/2018 | Micks | G06F 17/5009 340/932.2 |

FOREIGN PATENT DOCUMENTS

| | | |
|---|---|---|
| CN | 102623795 A | 8/2012 |
| CN | 103718059 A | 4/2014 |
| TW | 201346309 A | 11/2013 |

\* cited by examiner

PARKING SPACE STATUS SENSING SYSTEM AND METHOD

CROSS-REFERENCE TO RELATED APPLICATIONS

This application claims the benefit of U.S. Provisional Application No. 62/343,022, filed on May 30, 2016, which is hereby incorporated by reference for all purposes as if fully set forth herein.

FIELD OF INVENTION

The present invention relates to a field of micro-wave detection, and more particularly to a parking space status sensing system and method for detecting a parking space status.

DESCRIPTION OF PRIOR ART

For detecting whether a parking space is occupied by a car or not, the conventional art applies a method of frequency modulated continuous waveform (FWCW) with an active antenna design. The active antenna is a single loop antenna with an omnidirectional sensing range, which is suitable to be disposed on a center position under a car when the car is parked. However, the detecting range is limited within 50 centimeters (cm). If this method is applied with a solar energy supply system, daylight hours will be too short, and the detecting device will stop working due to insufficient charging, when the parking time of a car is too long or the parking frequencies of cars are too high. When the detecting device is disposed at a side of the car when the car is parked, the omnidirectional antenna is easily influenced by other cars travelling in a lane beside the parking space or metal signs (traffic signs or road signs) beside the parking space. In addition, false detection easily occurs when a car passes by without parking in the parking space.

Hence, it is necessary to provide a detecting device which is able to accurately determine the using status of a parking space without limiting the disposing position of the detecting device.

SUMMARY OF THE INVENTION

In order to solve the technical issue of the conventional art, one objective of the present application is to provide a parking space status detecting device which can precisely determine the using status of a parking space, without limiting the disposing position of the detecting device.

The present application provides a parking space status sensing system, for detecting a status of a parking space. The parking space sensing system comprises a microwave detecting module, which comprises a first antenna, a second antenna, a radio-frequency transceiver, a first amplifying filter, a first integral circuit, an envelope demodulator, a second amplifying filter, and a second integral circuit. The first antenna array transmits a first signal. The second antenna array receives a second signal, formed by reflecting the first signal from an object. The radio-frequency transceiver receives the second signal and performs down-conversion and demodulation on the second signal with a local signal, which is modulated (linear frequency modulation) from a triangularly modulated signal by the radio-frequency transceiver, and generating a first beat frequency signal. The first amplifying filter is connected with the radio-frequency transceiver, amplifying and filtering the first beat frequency signal to obtain a second beat frequency signal; the second beat frequency signal comprises a signal indicating a specific distance-range between the microwave detecting module and the object. The first integral circuit is connected with the first amplifying filter and integrates the second beat frequency signal to obtain an analog-distance-signal-integral information of the object. The envelope demodulator is connected with the first amplifying filter, performing envelope detection and amplitude modulation (AM) demodulation on the second beat frequency signal to obtain a first Doppler signal. The second amplifying filter is connected with the envelop-demodulation sub-module, amplifying and filtering the first Doppler signal to obtain a second Doppler signal; the second Doppler signal comprises a signal indicating a specific speed-range between the microwave detecting module and the object. The second integral circuit is connected with the second amplifying filter and integrates the second Doppler signal to obtain an analog-speed-signal-integral information of the object.

According to one embodiment of the present invention, the parking space status sensing system is disposed beside the parking space or in the ground at the center of the parking space.

According to one embodiment of the present invention, the parking space status sensing system further comprises a communication module transmitting the analog-distance-signal-integral information and the analog-speed-signal-integral information to an exterior communication system.

According to one embodiment of the present invention, the first antenna array and the second antenna array are directional dual antennas.

According to one embodiment of the present invention, the first antenna array, the second antenna array, and the radio-frequency transceiver are integrated on a circuit board.

According to one embodiment of the present invention, the envelope detection and the AM demodulation performed by the radio-frequency transceiver are both analog signal processes.

According to one embodiment of the present invention, the microwave detecting module further comprises a first comparator and a second comparator. The first comparator compares the analog-distance-signal-integral information with a voltage reference value to obtain a distance-status Boolean value. The second comparator compares the analog-speed-signal-integral information with the other voltage reference value to obtain a speed-status Boolean value.

According to one embodiment of the present invention, a status of the parking space is determined by a comparison result, obtained by comparing the distance-status Boolean value and the speed-status Boolean value with a Boolean logic chart.

According to one embodiment of the present invention, the distance-status Boolean value is 0 and the speed-status Boolean value is 0, which means the parking space is un-occupied according to the comparison result based on the Boolean logic chart, when a voltage value of the analog-distance-signal-integral information is smaller than the voltage reference value and a voltage value of the analog-speed-signal-integral information is smaller than the other voltage reference value.

According to one embodiment of the present invention, the distance-status Boolean value is 0 and the speed-status Boolean value is 1, which means the object passes by the parking space without parking, according to the comparison result based on the Boolean logic chart, when a voltage value of the analog-distance-signal-integral information is smaller than the voltage reference value and a voltage value of the analog-speed-signal-integral information is larger than the other voltage reference value.

According to one embodiment of the present invention, the distance-status Boolean value is 1 and the speed-status Boolean value is 1, which means the object is moved on the parking space, according to the comparison result based on the Boolean logic chart, when a voltage value of the analog-distance-signal-integral information is larger than the voltage reference value and a voltage value of the analog-speed-signal-integral information is larger than the other voltage reference value.

According to one embodiment of the present invention, the distance-status Boolean value is 1 and the speed-status Boolean value is 0, which means the parking space is occupied, according to the comparison result based on the Boolean logic chart, when a voltage value of the analog-distance-signal-integral information is larger than the voltage reference value and a voltage value of the analog-speed-signal-integral information is smaller than the other voltage reference value.

One embodiment of the present invention further discloses a parking space status sensing method for detecting a status of a parking space, the parking space sensing method comprises: a first signal is transmitted; a second signal formed by reflecting the first signal from an object is received; a beat frequency signal is obtained by performing down-conversion and demodulation on the second signal with a local signal, which is modulated from a triangularly modulated signal, by a radio-frequency transceiver; an analog-distance-signal-integral information of the object is obtained by performing a first analog signal process on the beat frequency signal and an analog-speed-signal-integral information of the object is obtained by performing a second analog signal process on the beat frequency signal, the second analog signal process comprises envelope detection and amplitude modulation (AM) demodulation.

The microwave detecting device used in the present invention is suitable for detecting whether there is a metal material and a motion detection of the metal material over a short distance. To the management of parking spaces, it is able not only to determine the status of the parking space (occupied or not), but also the replacement status of the parking space. The detecting device can be disposed in indoor parking spaces or roadside parking spaces, and be buried in the ground with floor lamps or other moisture-weight resistant devices, combined with solar panels and wireless networks, accomplishing a parking space management system setup of a smart city.

DETAILED DESCRIPTION OF THE PREFERRED EMBODIMENTS

In order that the objects, technical proposals, and advantages of the present invention become more apparent, the embodiments of the present invention will be described in detail with reference to the accompanying drawings.

Figure 1:
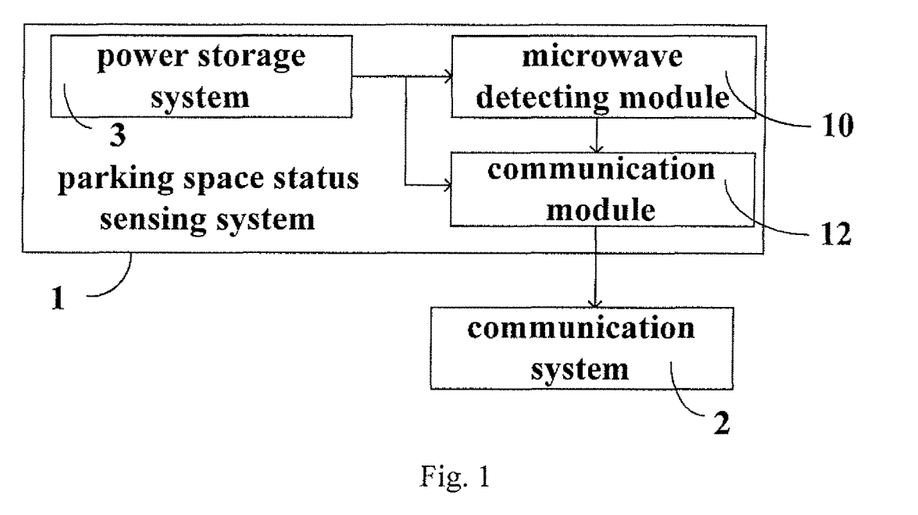
FIG. 1 is a block diagram of a parking space sensing system of one embodiment according to the present invention.
Figure 2:
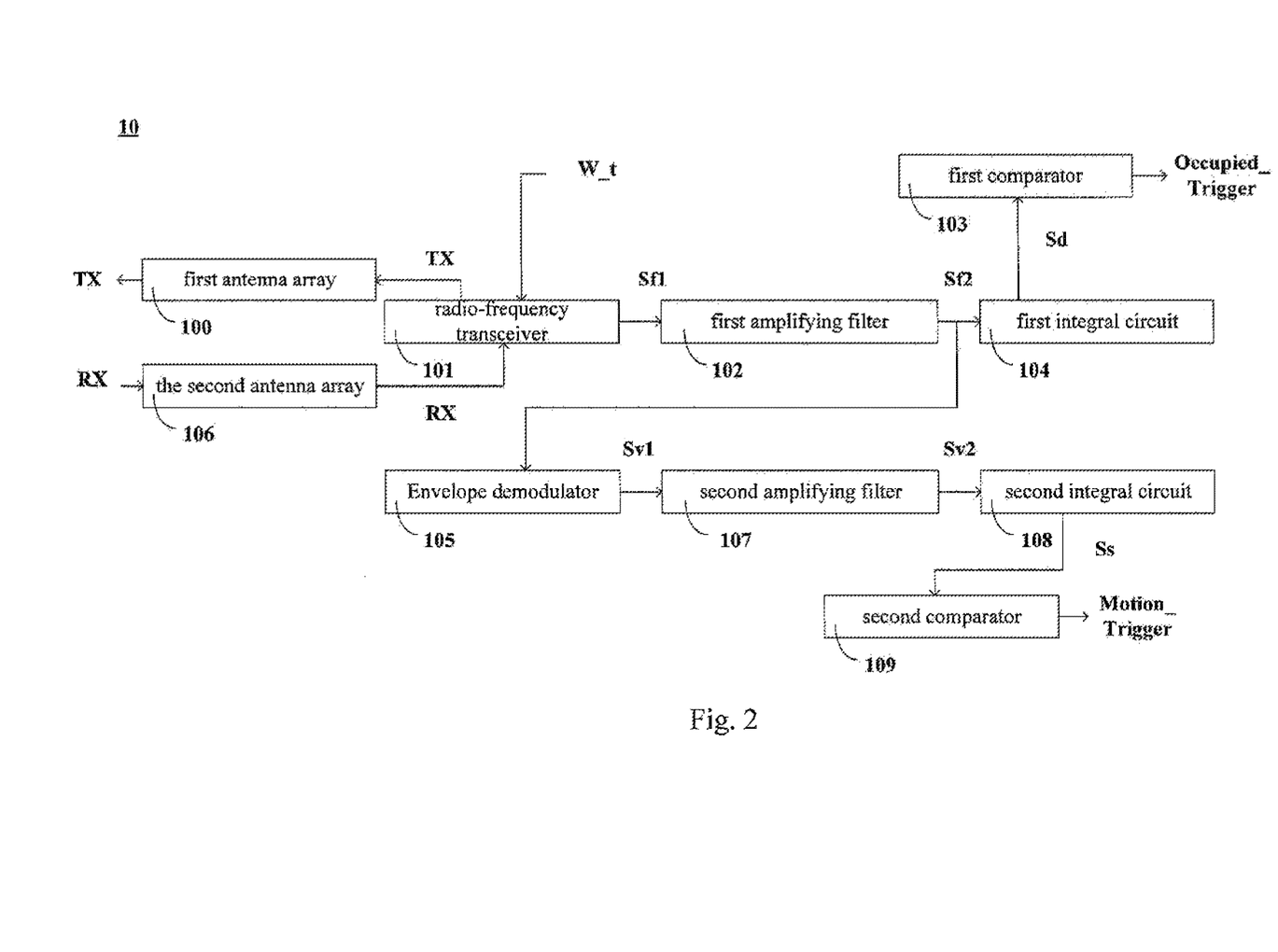
FIG. 2 is a block diagram of a microwave detecting module of the parking space sensing system of the embodiment according to the present invention.

Please refer to FIG. 1 and FIG. 2. FIG. 1 is a block diagram of a parking space sensing system 1 of one embodiment according to the present invention. The parking space sensing system 1 comprises a microwave detecting module 10. FIG. 2 is a block diagram of a microwave detecting module 10. The microwave detecting module 10 comprises a first antenna 100 and a second antenna 105. The first antenna array 100 transmits a first signal TX, The first signal TX is a linear frequency modulation signal. Generally, a second signal RX is reflected when the first signal TX touches an object. For example, the object is a car, the first signal TX will reflect when the car passes by the parking space or stops at the parking space. The second antenna array 105 receives the second signal RX, formed by reflecting the first signal TX from an object.

The microwave detecting module 10 further comprises a radio-frequency transceiver 101, a first amplifying filter, a first integral circuit, an envelope demodulator, a second amplifying filter, and a second integral circuit. The radio-frequency transceiver 101 performs down-conversion and demodulation on the second signal RX with a local signal, which is modulated from a triangularly modulated (linear frequency modulation) signal W_t, by the radio-frequency transceiver 101, and generating a first beat frequency signal Sf1. In the technical field of the present invention, the first beat frequency signal Sf1 represents "distance". The first amplifying filter 102 is connected with the radio-frequency transceiver 101, amplifying and filtering the first beat frequency signal Sf1 to obtain a second beat frequency signal Sf2. The second beat frequency signal Sf2 comprises a signal indicating a specific distance-range between the microwave detecting module 10 and the object, such as 75-100 centimeters. Signals over the specific distance-range, such as a distance over 101 centimeters will be considered as non-relevant signals for "too far away", a distance within 74 centimeters will be considered as non-relevant signals for "people or animals in the parking space". In other words, it is like a concept of a distance gate. The first amplifying filter 102 amplifies the entire signal, then to filter out the needless distance signals. In the application field of parking space detection, only distance signals within the specific distance-range such as 75-100 centimeters are needed to be detected, the accuracy is raised by eliminating the rest of the distance signals. Generally, the beat frequency signal comprises information of distance and speed, only the distance signals are able to be obtained by analog processes without envelope demodulation, the speed signals are able to be obtained after the envelope demodulation. The first integral circuit 104 is connected with the first amplifying filter 102 and integrates the second beat frequency signal Sf2 to obtain an analog-distance-signal-integral information of the object, and to determine whether the parking space is occupied by comparing the analog-distance-signal-integral information of the object Sd with a setup limiting coefficient. The main purpose of the first integral circuit 104 is to change the second beat frequency signal Sf2, which is a sine wave, into a signal, which is easy to be compared with a specific value. The reason is that the second beat frequency signal Sf2 is a sine wave, which continuously changes between negative and positive. With integration, the analog-distance-signal-integral information of the object Sd will be a constant positive value, which will ease the operation loading afterwards. The integrated analog-distance-signal-integral information of the object Sd indicates the distance between the object and the parking space, for example, when the distance is over 100 centimeters, the object is not in the parking space, which means that the parking space is un-occupied, oppositely, which means that he parking space is occupied or will be occupied. The envelope demodulator 105 is connected with the first amplifying filter 102, performing envelope detection and amplitude modulation (AM) demodulation on the second beat frequency signal Sf2 to obtain a first Doppler signal Sv1. Basically, the first Doppler signal Sv1 is a speed signal. The second amplifying filter 107 is connected with the envelop-demodulation sub-module 105, amplifying and filtering the first Doppler signal Sv1 to obtain a second Doppler signal Sv2. The second Doppler signal Sv2 comprises a signal indicating a specific speed-range between the microwave detecting module 10 and the object. The second Doppler signal Sv2 comprises a signal indicating a specific speed-range between the microwave detecting module 10 and the object, such as 0-30 kilometers per hour. Signals over the specific speed-range, such as a speed of 35 kilometers per hour means the object just passed by without parking. The second integral circuit 108 is connected with the second amplifying filter 107 and integrate the second Doppler signal Sv2 to obtain an analog-speed-signal-integral information of the object Ss, to determine whether the object is going to stop, by comparing the analog-speed-signal-integral information of the object Ss with the other setup limiting coefficient.

Preferably, the parking space status sensing system 1 is disposed beside the parking space or in the ground at the center of the parking space. The first amplifying filter 102 connects with the radio-frequency transceiver 101.

Further, an outdoor independent module without wiring (including power wires and signal wires) is obtained, with integrating the parking space status sensing system 1, a communication system 2, and a power storage system 3 (solar energy or battery set with large capacity).

Additionally, the radio-frequency transceiver 101 performs down-conversion and demodulation on the second signal RX with a local signal, which is modulated from a triangularly modulated (linear frequency modulation) signal W_t, by the radio-frequency transceiver 101, and generating a first beat frequency signal Sf1, with using the frequency band not less than K-band (24.150 GHz). The modulated signal source can be disposed inside or outside of the radio-frequency transceiver 101. In the preferred embodiment, the modulated signal source is disposed outside of the radio-frequency transceiver 101.

In detail, the envelope detection and the AM demodulation performed by the radio-frequency transceiver 105 are both analog signal processes.

Preferably, the first antenna array 100 and the second antenna array 106 comprise directional dual antennas. Additionally, the first antenna array 100 and the second antenna array 106 are used to transmit the first signal TX to the object and receive the second signal RX, formed by reflecting the first signal TX from the object. A directional narrow beam radiation is applied for partial detection of metal surface of a side, a front, and a rear of a car. Hence, it is able to solve the issues of insufficient charge of solar energy caused by a long-time parking when the detector is disposed below the car or power exhaustion. The first beat frequency signal Sf1 is a beat frequency signal demodulated from frequency modulated continuous waveform (FMCW), which has features of range gate, in other words, the first beat frequency signal will choose a limited distance-range at radiative paths, then the miss-trigger will be greatly reduced, for the influence of objects walking in the lane beside the parking space and metal signs (traffic signs or road signs) beside the parking space will be eliminated.

Preferably, the first antenna array 100, the second antenna array 106, and the radio-frequency transceiver 101 are integrated on a circuit board, four high frequency plugs and two coaxial cables are saved, the cost is reduced and the package is convenient. As mentioned above, the first amplifying filter 102, and the second amplifying filter 107 are connected with the radio-frequency transceiver 101 by stamp holes, the debug issues within a four-layer plywood process are eliminated and the cost is reduced. The first antenna array 100 and the second antenna array 106 are individually used to perform transmitting and receiving, each of the first antenna array 100 and the second antenna array 106 is a 2×2 antenna array, which occupies an area of 30 millimeters×30 millimeters.

Preferably, the microwave detecting module 10 connects with a communication module 12 transmitting the status of the digital processor to the exterior communication system 2. The status can be transmitted to the communication system 2 through ZigBee, Bluetooth, and Lora. Then, the status is transmitted to the users through a router, the user can be informed the status of the parking space with application inside the mobile device of the users.

The frequency of the first signal TX transmitted by the first antenna array 100 is fT, The frequency of the second signal RX received by the second antenna array 106 is fR, the difference between the two frequencies is fb, which is the frequency of the first beat frequency signal Sf1. When the object moves, the second beat frequency signal Sf2 is obtained by transmitting the first beat frequency signal Sf1 to the first amplifying filter 102. Then, the second beat frequency signal Sf2 is transmitted to envelope demodulator 105 for envelope detection and amplitude modulation (AM) demodulation, which means to perform signal demodulation with AM on an outer envelope at time-domain of the first beat frequency signal Sf1, in other words, this is an AM Envelope Detecting method, to derive the first Doppler signal Sv1 by removing the distance signals of the first beat frequency signal Sf1 with the AM Envelope Detecting method. Hence, the microwave detecting module 10 can derive the analog-distance-signal-integral information of the object Sd and the analog-speed-signal-integral information of the object Ss. In other words, the analog-distance-signal-integral information of the object Sd and the analog-speed-signal-integral information of the object Ss can be obtained, by calculating the first beat frequency signal Sf1.

The analog-distance-signal-integral information of the object Sd and the analog-speed-signal-integral information of the object Ss are compared with the setup limiting coefficients to output Boolean values individually, which will be discussed afterwards. The main purpose of the second integral circuit 108 is to change the second Doppler signal Sv2, which is a sine wave, into a signal, which is easy to be compared with a specific value. The reason is similar to the purpose of the first integral circuit 104, no more discussion is necessary.

Please refer to chart 1, which is a Boolean logic chart according to the preferred embodiment of the present invention. The analog-distance-signal-integral information of the object Sd and the analog-speed-signal-integral information of the object Ss can be used to determine the status of the parking space with respect to the table 1. There are four combinations according to the distance-status Boolean value Occupied_Trigger and the speed-status Boolean value Motion_Trigger, the combinations can be outputted as two bits General-purpose input/output (GPIO), corresponding to four logics of the status of the parking space; further, these are able to be used as references of the status of the parking space for determination of back-end digital modules and management systems. In detail, the status of the parking space comprises a distance status and a speed status. A first comparator 103 compares the analog-distance-signal-integral information Sd with a voltage reference value to obtain a distance-status Boolean value Occupied_Trigger. A second comparator 109 compares the analog-speed-signal-integral information Ss with the other voltage reference value to obtain a speed-status Boolean value Motion_Trigger. When the analog-distance-signal-integral information Sd is smaller than the voltage reference value, the distance-status Boolean value Occupied_Trigger is 0, and the analog-speed-signal-integral information Ss is smaller than the other voltage reference value, the speed-status Boolean value Motion_Trigger is 0, which means the parking space is un-occupied according to the comparison result based on the Boolean logic chart. When the analog-distance-signal-integral information Sd is smaller than the voltage reference value, the distance-status Boolean value Occupied_Trigger is 0, and the analog-speed-signal-integral information Ss is larger than the other voltage reference value, the speed-status Boolean value Motion_Trigger is 1, which means the object passed by the parking space without parking, according to the comparison result based on the Boolean logic chart. When the analog-distance-signal-integral information Sd is larger than the voltage reference value, the distance-status Boolean value Occupied_Trigger is 1, and the analog-speed-signal-integral information Ss is larger than the other voltage reference value, the speed-status Boolean value Motion_Trigger is 1, which means the object moved on the parking space, according to the comparison result based on the Boolean logic chart. When the analog-distance-signal-integral information Sd is larger than the voltage reference value, the distance-status Boolean value Occupied_Trigger is 1, and the analog-speed-signal-integral information Ss is smaller than the other voltage reference value, the speed-status Boolean value Motion_Trigger is 0, which means the parking space is occupied, according to the comparison result based on the Boolean logic chart.

| Corresponding status | the parking space is un-occupied | the object passed by the parking space without parking | The object on the parking space is changing | the parking space is occupied |
|---|---|---|---|---|
| distance-status Boolean value | 0 | 0 | 1 | 1 |
| speed-status Boolean value | 0 | 1 | 1 | 0 |

Figure 3:
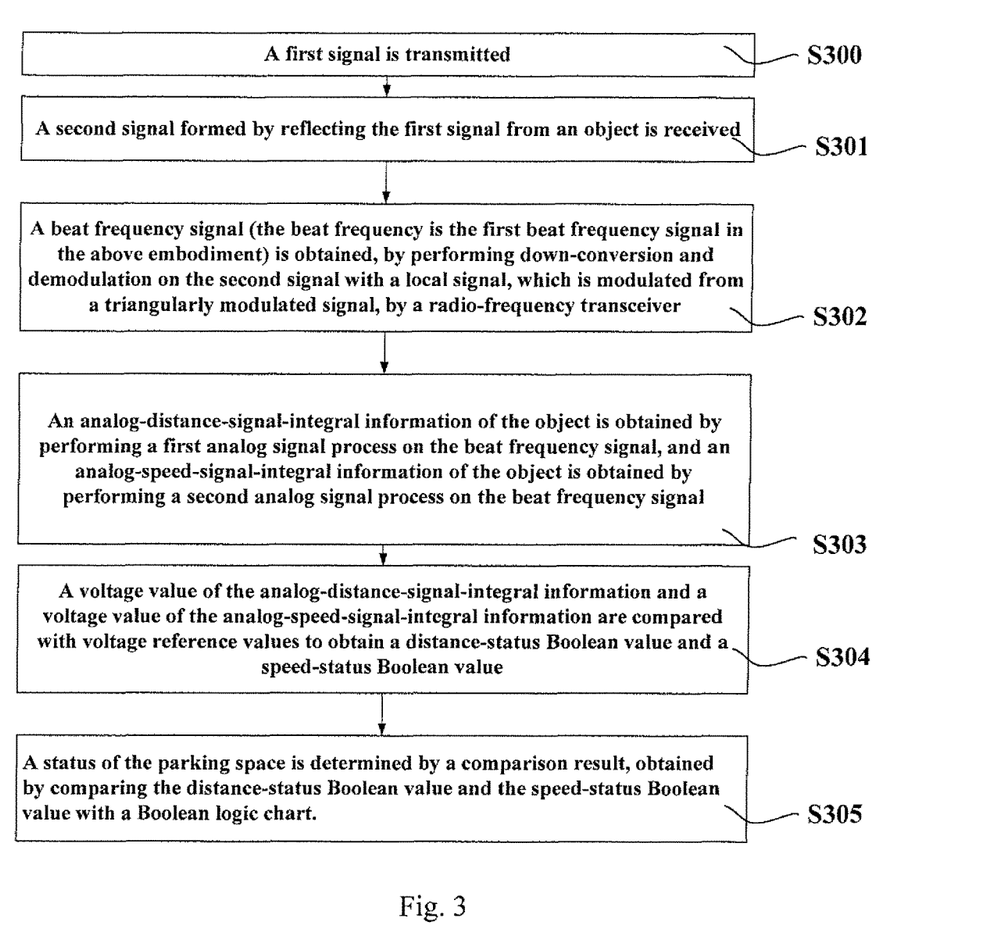
FIG. 3 is a flow diagram of a parking space sensing method of one embodiment according to the present invention.

Please refer to FIG. 3, which is a flow diagram of a parking space sensing method of one embodiment according to the present invention. The numbers used in the flow chart of the present method are referred to in the above-described preferred embodiments and are not described herein in detail. One embodiment of the present invention discloses a parking space status sensing method, for detecting a status of a parking space, the parking space sensing method comprises:

300: A first signal TX is transmitted.
301: A second signal RX formed by reflecting the first signal TX from an object is received.
302: A beat frequency signal (the beat frequency is the first beat frequency signal in the above embodiment) is obtained, by performing down-conversion and demodulation on the second signal RX with a local signal, which is modulated from a triangularly modulated signal W_t, by a radio-frequency transceiver 101.

303: An analog-distance-signal-integral information of the object Sd is obtained by performing a first analog signal process on the beat frequency signal, and an analog-speed-signal-integral information of the object Ss is obtained by performing a second analog signal process on the beat frequency signal (the detail generating process of the analog-distance-signal-integral information of the object Sd is like the analog-distance-signal-integral information of the object Sd of the above embodiment, the detail generating process of the analog-speed-signal-integral information of the object Ss is like the analog-speed-signal-integral information of the object Ss of the above embodiment). The first analog process comprises all relating analog process from the first beat frequency signal Sf1 to the analog-distance-signal-integral information of the object Sd, such as amplification, filtration, and integration. The second analog signal process comprises all relating analog process from the first beat frequency signal Sf1 to the analog-speed-signal-integral information of the object Ss, such as envelope detection and amplitude modulation (AM) demodulation, amplification, filtration, and integration.

304: A voltage value of the analog-distance-signal-integral information Sd and a voltage value of the analog-speed-signal-integral information Ss are compared with voltage reference values to obtain a distance-status Boolean value Occupied_Trigger and a speed-status Boolean value Motion_Trigger.

305: A status of the parking space is determined by a comparison result, obtained by comparing the distance-status Boolean value Occupied_Trigger and the speed-status Boolean value Motion_Trigger with a Boolean logic chart.

The microwave detecting device used in the present invention is suitable for detecting whether there is a metal material and a motion detection of the metal material over a short distance. To the management of parking spaces, it is able not only to determine the status of the parking space (occupied or not), but also the replacement status of the parking space. The detecting device can be disposed in indoor parking spaces or roadside parking spaces, and be buried in the ground with floor lamps or other moisture-weight resistant devices, and combined with solar panels and wireless networks, thereby accomplishing a parking space management system setup of a smart city.

The present invention derives the speed information which is included within the distance information of the beat frequency signal with envelope detection and amplitude modulation (AM) demodulation, based on analog circuit design. In other words, with the analog calculation of the first signal TX and the second signal RX, information about the distance between the object and the parking space, and the speed of the object are obtained. Compared with the digital circuit, the power required is greatly reduced.

The above are only preferred embodiments of the present invention and are not to be construed as limiting the present invention. Any modifications, equivalent substitutions, improvements and the like within the spirit and principle of the present invention should be included in the protection range of the present invention.

What is claimed is:

1. A parking space status sensing system for detecting a status of a parking space, comprising:
a microwave detecting module, comprising:
a first antenna array transmitting a first signal;
a second antenna array receiving a second signal, which is formed by reflecting the first signal from an object;
a radio-frequency transceiver performing down-conversion and demodulation the second signal with a local signal, which is modulated from a triangularly modulated signal by the radio-frequency transceiver, and generating a first beat frequency signal;
a first amplifying filter connected with the radio-frequency transceiver, amplifying and filtering the first beat frequency signal to obtain a second beat frequency signal, which comprises a signal indicating a specific distance range between the microwave detecting module and the object;
a first integration circuit connected with the first amplifying filter, and integrating the second beat frequency signal to obtain integral information of an analog distance signal of the object;
an envelope demodulator connected with the first amplifying filter, performing envelope detection and amplitude modulation (AM) demodulation on the second beat frequency signal to obtain a first Doppler signal;
a second amplifying filter connected with the envelope demodulator, amplifying and filtering the first Doppler signal to obtain a second Doppler signal, the second Doppler signal comprises a signal indicating a specific speed-range between the microwave detecting module and the object; and
a second integral circuit connected with the second amplifying filter and integrate the second Doppler signal to obtain an analog-speed-signal-integral information of the object.

2. The parking space status sensing system according to claim 1, wherein the parking space status sensing system is disposed beside the parking space or in the ground at the center of the parking space.

3. The parking space status sensing system according to claim 1, further comprising a communication module transmitting the analog-distance-signal-integral information and the analog-speed-signal-integral information to an exterior communication system.

4. The parking space status sensing system according to claim 1, wherein the first antenna array and the second antenna array are directional dual antennas.

5. The parking space status sensing system according to claim 1, wherein the first antenna array, the second antenna array, and the radio-frequency transceiver are integrated on a circuit board.

6. The parking space status sensing system according to claim 1, wherein the envelope detection and the AM demodulation performed by the radio-frequency transceiver are both analog signal processes.

7. The parking space status sensing system according to claim 1, wherein the microwave detecting module further comprises:
a first comparator comparing the analog-distance-signal-integral information with a voltage reference value to obtain a distance-status Boolean value; and
a second comparator comparing the analog-speed-signal-integral information with other voltage reference value to obtain a speed-status Boolean value.

8. The parking space status sensing system according to claim 1, wherein a status of the parking space is determined by a comparison result obtained by comparing the distance-status Boolean value and the speed-status Boolean value with a Boolean logic chart.

9. The parking space status sensing system according to claim 1, wherein the distance-status Boolean value is 0 and the speed-status Boolean value is 0, which means the parking space is un-occupied according to the comparison result based on the Boolean logic chart, when a voltage value of the analog-distance-signal-integral information is smaller than the voltage reference value and a voltage value of the analog-speed-signal-integral information is smaller than the other voltage reference value.

10. The parking space status sensing system according to claim 1, wherein the distance-status Boolean value is 0 and the speed-status Boolean value is 1, which means the object passes by the parking space without parking, according to the comparison result based on the Boolean logic chart, when a voltage value of the analog-distance-signal-integral information is smaller than the voltage reference value and a voltage value of the analog-speed-signal-integral information is larger than the other voltage reference value.

11. The parking space status sensing system according to claim 1, wherein the distance-status Boolean value is 1 and the speed-status Boolean value is 1, which means the object is moved on the parking space, according to the comparison result based on the Boolean logic chart, when a voltage value of the analog-distance-signal-integral information is larger than the voltage reference value and a voltage value of the analog-speed-signal-integral information is larger than the other voltage reference value.

12. The parking space status sensing system according to claim 1, wherein the distance-status Boolean value is 1 and the speed-status Boolean value is 0, which means the parking space is occupied, according to the comparison result based on the Boolean logic chart, when a voltage value of the analog-distance-signal-integral information is larger than the voltage reference value and a voltage value of the analog-speed-signal-integral information is smaller than the other voltage reference value.

13. A parking space status sensing method, for detecting a status of a parking space, the parking space sensing method comprising:
transmitting a first signal;
receiving a second signal, formed by reflecting the first signal from an object;
deriving a beat frequency signal, by performing down-conversion and demodulation on the second signal with a local signal, which is modulated from a triangularly modulated signal, by a radio-frequency transceiver; and
deriving an analog-distance-signal-integral information of the object, by performing a first analog signal process on the beat frequency signal and an analog-speed-signal-integral information of the object, by performing a second analog signal process on the beat frequency signal, the second analog signal process comprises envelope detection and amplitude modulation (AM) demodulation.

14. The parking space status sensing method according to claim 13, wherein the parking space status sensing method is performed by a parking space status sensing system disposed beside the parking space or in the ground at the center of the parking space.

15. The parking space status sensing method according to claim 13, further comprises:

comparing a voltage value of the analog-distance-signal-integral information and a voltage value of the analog-speed-signal-integral information with voltage reference values to obtain a distance-status Boolean value and a speed-status Boolean value.

16. The parking space status sensing method according to claim 15, further comprising:
   determining a status of the parking space by a comparison result, obtained by comparing the distance-status Boolean value and the speed-status Boolean value with a Boolean logic chart.

17. The parking space status sensing method according to claim 16, further comprising: transmitting the status of the parking space to an exterior communication system.

18. The parking space status sensing method according to claim 15, wherein the distance-status Boolean value is 0 and the speed-status Boolean value is 0, which means the parking space is un-occupied according to the comparison result based on the Boolean logic chart, when a voltage value of the analog-distance-signal-integral information is smaller than the voltage reference value and a voltage value of the analog-speed-signal-integral information is smaller than the other voltage reference value.

19. The parking space status sensing method according to claim 15, wherein, the distance-status Boolean value is 0 and the speed-status Boolean value is 1, which means the object passes by the parking space without parking, according to the comparison result based on the Boolean logic chart, when a voltage value of the analog-distance-signal-integral information is smaller than the voltage reference value and a voltage value of the analog-speed-signal-integral information is larger than the other voltage reference value.

20. The parking space status sensing method according to claim 15, wherein, the distance-status Boolean value is 1 and the speed-status Boolean value is 1, which means the object is moved on the parking space, according to the comparison result based on the Boolean logic chart, when a voltage value of the analog-distance-signal-integral information is larger than the voltage reference value and a voltage value of the analog-speed-signal-integral information is larger than the other voltage reference value.

21. The parking space status sensing method according to claim 15, wherein, the distance-status Boolean value is 1 and the speed-status Boolean value is 0, which means the parking space is occupied, according to the comparison result based on the Boolean logic chart, when a voltage value of the analog-distance-signal-integral information is larger than the voltage reference value and a voltage value of the analog-speed-signal-integral information is smaller than the other voltage reference value.

* * * * *